United States Patent
Tanabe et al.

(10) Patent No.: US 6,360,657 B1
(45) Date of Patent: Mar. 26, 2002

(54) PRINTER

(75) Inventors: Naoki Tanabe, Saitama-ken; Satoru Tada, Noda, both of (JP)

(73) Assignee: Seiko Precision, Inc., Tokyo (JP)

( * ) Notice: Subject to any disclaimer, the term of this patent is extended or adjusted under 35 U.S.C. 154(b) by 0 days.

(21) Appl. No.: 09/387,536

(22) Filed: Aug. 31, 1999

(30) Foreign Application Priority Data

Aug. 31, 1998 (JP) .......................................... 10-245507

(51) Int. Cl.[7] ................................................ B41F 11/00
(52) U.S. Cl. ........................................ 101/44; 400/605
(58) Field of Search ..................... 101/44, 36, 38.1, 101/40.1, 35; 400/605, 607, 642, 708, 56, 57, 58; 271/223

(56) References Cited

U.S. PATENT DOCUMENTS

| | | | | |
|---|---|---|---|---|
| 4,798,374 A | * | 1/1989 | Ito .................................. | 271/9 |
| 4,900,172 A | * | 2/1990 | Svoboda ...................... | 400/605 |
| 5,018,655 A | * | 5/1991 | Koike et al. ............. | 400/636.3 |
| 5,035,413 A | * | 7/1991 | Yamada et al. ................ | 271/9 |
| 5,320,436 A | * | 6/1994 | Hock et al. ................. | 400/283 |
| 5,419,644 A | | 5/1995 | Martin et al. | |
| 5,510,909 A | * | 4/1996 | Morikawa et al. .......... | 358/498 |
| 5,573,337 A | * | 11/1996 | Yasuoka ..................... | 400/605 |
| 5,806,992 A | * | 9/1998 | Ju ................................. | 400/56 |
| 5,842,801 A | * | 12/1998 | Myung ........................ | 400/708 |
| 6,148,722 A | * | 11/2000 | Hagstrom ..................... | 101/35 |

FOREIGN PATENT DOCUMENTS

| | | |
|---|---|---|
| EP | 0 359 584 A2 | 3/1990 |
| EP | 0 441 448 A1 | 8/1991 |
| JP | 9-95021 A | 8/1997 |

* cited by examiner

Primary Examiner—John S. Hilten
Assistant Examiner—Darius N. Cone
(74) Attorney, Agent, or Firm—Schulte Roth & Zabel; Donna L. Angotti; Joel E. Lutzker

(57) ABSTRACT

A printer is capable of stably feeding even a thin recording medium to a printing section and obtaining good print quality similar to that obtainable in the case of a thick recording medium. The printer comprises a first supply path for supplying a first recording medium, a second supply path for supplying a second recording medium thicker than the first recording medium, a printing section for printing on a recording medium supplied from the first supply path or the second supply path, and a delivery section for delivering the recording medium printed in the printing section. A guide spring member which is movable up and down is projected upstream of the printing section and in a meeting portion of the first supply path and the second supply path. This guide spring member serves to support a top surface of the first recording medium at a predetermined height.

9 Claims, 7 Drawing Sheets

PRINTER

BACKGROUND OF THE INVENTION

1. Field of the Invention

The present invention relates to a printer and, more particularly, to a printer which selectively guides a plurality of different forms of recording media to a common printing section through a plurality of supply paths and delivers each selectively guided recording medium to a delivery section after making a recording on the same.

2. Description of the Related Art

It has recently become necessary to print on a surface of a special form of recording medium such as a compact disc or a recordable compact disc (hereinafter referred to as "CD(s)"). Because the recording medium is special, a special supply path must be provided and a mechanism different from a general-purpose printer capable of handling cut paper is needed. It has heretofore been general practice to use a dedicated printer provided with a supply path suitable for such special recording medium. In contrast, a printer provided with supply paths for two or more kinds of recording media is disclosed in, for example, Japanese Patent No.A-9-95021, and is provided with a switching mechanism for switching the supply paths for the different recording media.

The conventional construction, provided with a switching mechanism, has the related problems that the structure becomes complicated and costs increase because of the switching mechanism.

SUMMARY OF THE INVENTION

To solve these problems, the object of the present invention is to provide an arrangement in which a plurality of supply paths, for supplying a plurality of recording media having different thicknesses, are of a simple construction and a guide spring member for supporting the top surface of a thin recording medium at a predetermined height is disposed in the meeting portion of the plurality of supply paths. With this arrangement, it is possible to stably feed even a thin recording medium into a printing section and to obtain good print quality similar to that obtainable in the case of a thick recording medium. In addition, it is possible to realize in one printer unit a general-purpose printer capable of handling cut paper and a special printer capable of handling a special recording medium such as a CD, and it is possible to provide an inexpensive printer with a simple construction.

A printer according to the present invention comprises a first supply path for supplying a first recording medium, a second supply path for supplying a second recording medium thicker than the first recording medium, a printing section for printing on a recording medium supplied from the first supply path or the second supply path, and a delivery section for delivering the recording medium printed in the printing section. A guide spring member, which is movable up and down, is projected upstream of the printing section and in a meeting portion of the first supply path and the second supply path. The guide spring member serves to support a top surface of the first recording medium at a predetermined height.

The first supply path serves to supply a soft recording medium, while the second path serves to supply a rigid recording medium. The second supply path leads to the printing section in a flat state. The second supply path is brought into the flat state when the guide spring member is moved down while the rigid recording medium is being supplied.

Preferably, the guide spring member is made from a leaf spring or includes a plate-shaped guide member and a compression spring disposed on a bottom surface of the plate-shaped guide member.

The rigid recording medium has, for example, a disk-like shape, and is preferably supplied in the state of being mounted in a disk-shaped recess provided in a rectangular tray.

Preferably, the printer further comprises a position sensing device for sensing the recording medium when it passes in the vicinity of the guide spring member.

The above and other objects, features and advantages of the present invention will become apparent from the following detailed description of preferred embodiments of the present invention, taken in conjunction with the accompanying drawings.

BRIEF DESCRIPTION OF THE DRAWINGS

FIG. 5(*b*) is an enlarged cross-sectional view of a guide spring member of the tray guide;

FIG. 5(*c*) is an enlarged cross-sectional view of the guide spring member of the tray guide, showing the state in which a tray is being supplied;

FIG. 6(*b*) is a perspective view of a tray in which to mount the CD;

DESCRIPTION OF THE PREFERRED EMBODIMENTS

Figure 1:
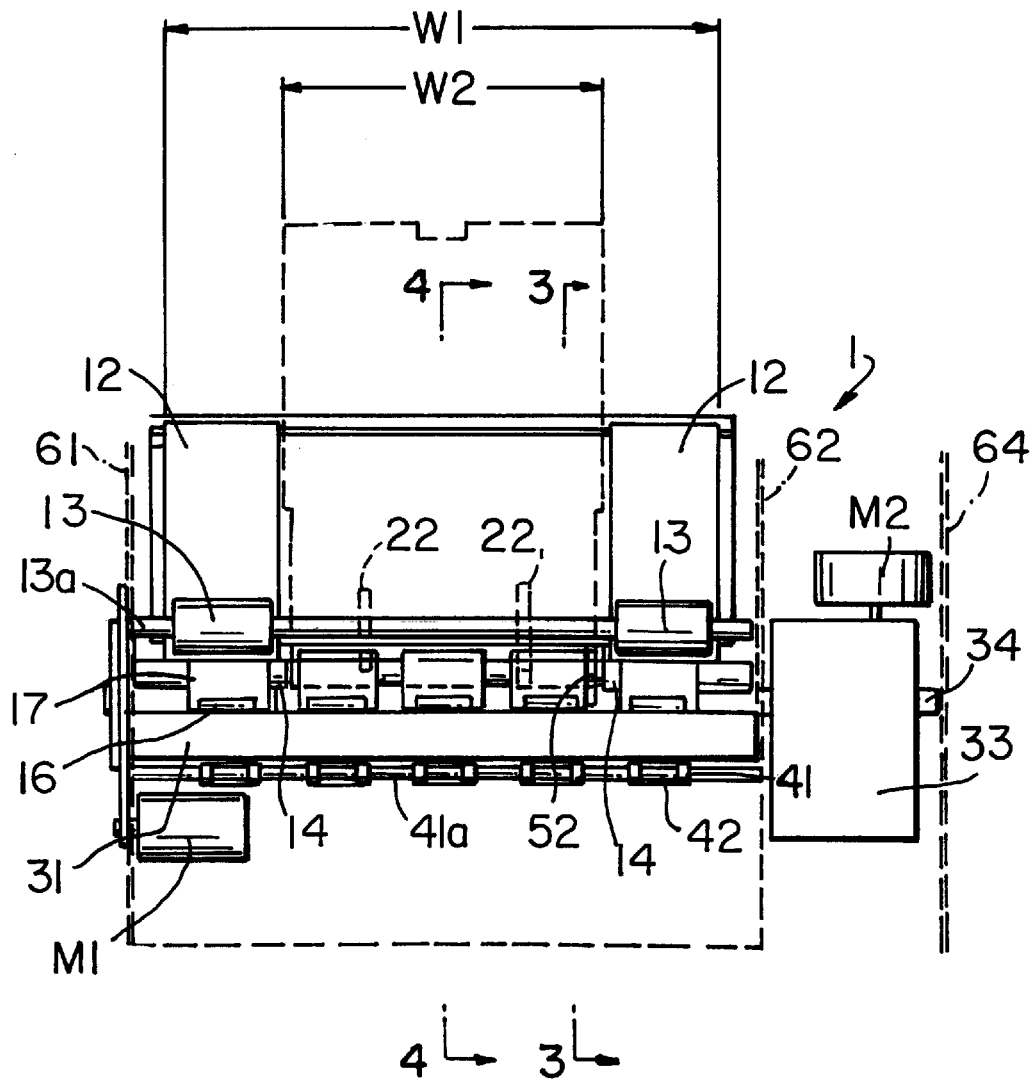
FIG. 1 is a diagrammatic plan view showing the entire construction of a printer to which the present invention is applied.
Figure 2:
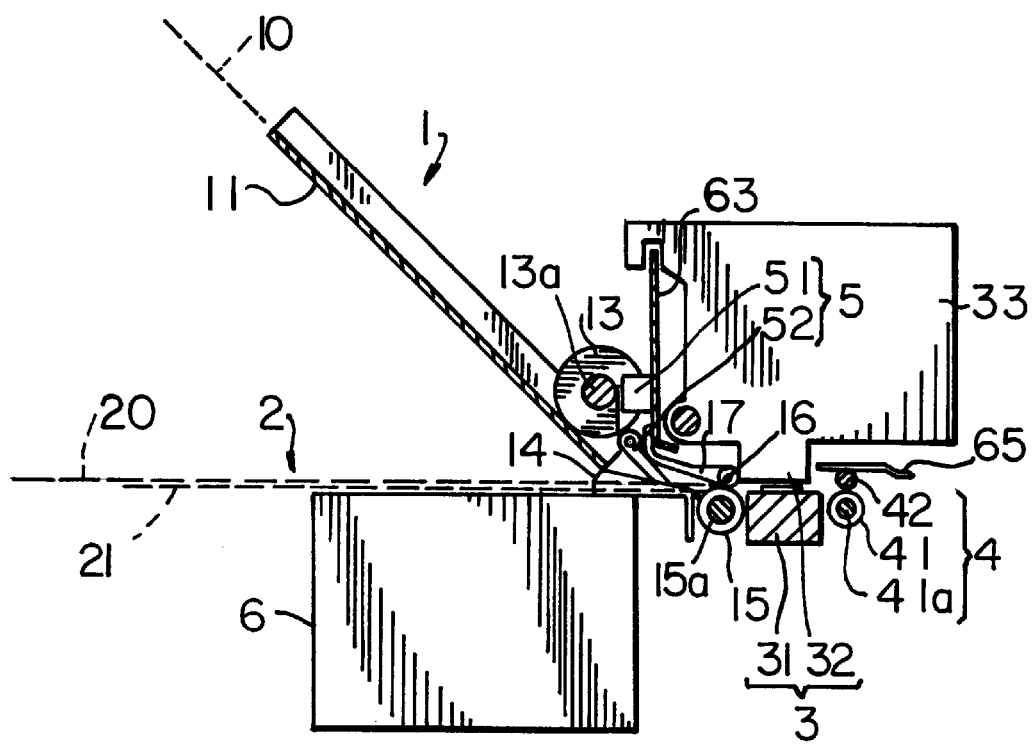
FIG. 2 is a diagrammatic side view showing the entire construction.

Preferred embodiments of the present invention will be described below with reference to the accompanying drawings. FIGS. 1 and 2 diagrammatically show the entire construction of a printer according to the present invention. The shown printer is provided with a first supply path 1 for supplying a recording medium 10 and a second supply path 2 for supplying a recording medium 20. Either of the recording media 10 or 20 is supplied to a common printing section 3 via the corresponding one of the supply paths 1 and 2, and after printing in the printing section 3, the recording medium 10 or 20 is delivered to a common delivery section 4.

The first supply path 1 is a path via which the recording medium 10 having a small thickness can be supplied to the printing section 3, and the recording medium 10 may be thin recording paper having a large width A1 as shown in FIG. 1. The recording medium 10 is placed on a cut sheet feeder (CSF) 11, and a pair of CSF guides 12 and a pair of feed rollers 13 are located on widthwise opposed sides of the CSF 11. The feed rollers 13 are fitted on a feed roller shaft 13a which is rotatably supported by frames 61 and 62 erected from a frame 6, and are, axially slidably and nonrotatably secured to the feed roller shaft 13a. The CSF guides 12 and the feed rollers 13 can cope with different widths of recording paper by being moved relatively toward or away from each other in the axial direction of the feed roller shaft 13a.

Figure 3:
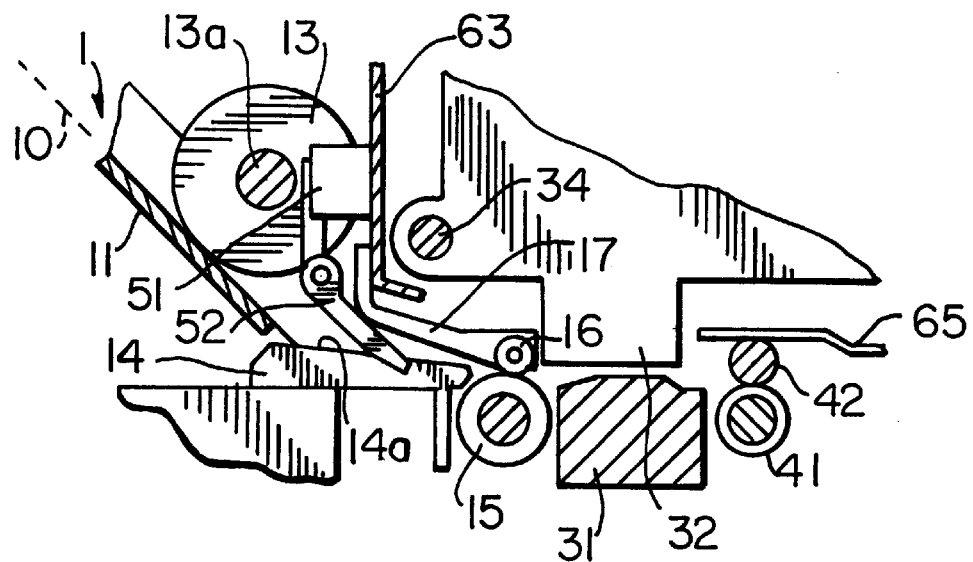
FIG. 3 is an enlarged cross-sectional view taken along line A—A of FIG. 1.

As shown in FIGS. 2 and 3, the CSF 11 which constitutes the first supply path 1 is inclined at approximately 45 degrees, and the recording medium 10 which is drawn out sheet by sheet by the feed rollers 13 is drawn into the gaps between feed rollers 15 and auxiliary rollers 16 while being guided and bent by the top surfaces of a pair of guide plates 14, and is then supplied to the printing section 3. The feed rollers 15 are located upstream of the printing section 3 and auxiliary rollers 16 are kept in elastic contact with the feed rollers 15. The recording medium 10 is thin and soft, so that a slack easily occurs in its widthwise intermediate portion and often causes defective feeding such as crinkled paper or oblique feeding. However, in the present invention, the occurrence of slack or the like is prevented by the guide plates 14 and guide spring members which will be described later. The respective top surfaces of the guide plates 14 are formed as inclined surfaces 14a which have a predetermined height and are suited to smoothly guide the recording medium 10 to the printing section 3. The feed rollers 15 are secured to a feed roller shaft 15a rotatably supported by the frames 61 and 62, and the respective auxiliary rollers 16 are supported for rotation about pins of auxiliary roller holders 17 and the auxiliary roller holders 17 are supported on a frame 63 in a cantilevered manner so that the auxiliary rollers 16 are kept in elastic contact with the feed rollers 15.

Figure 4:
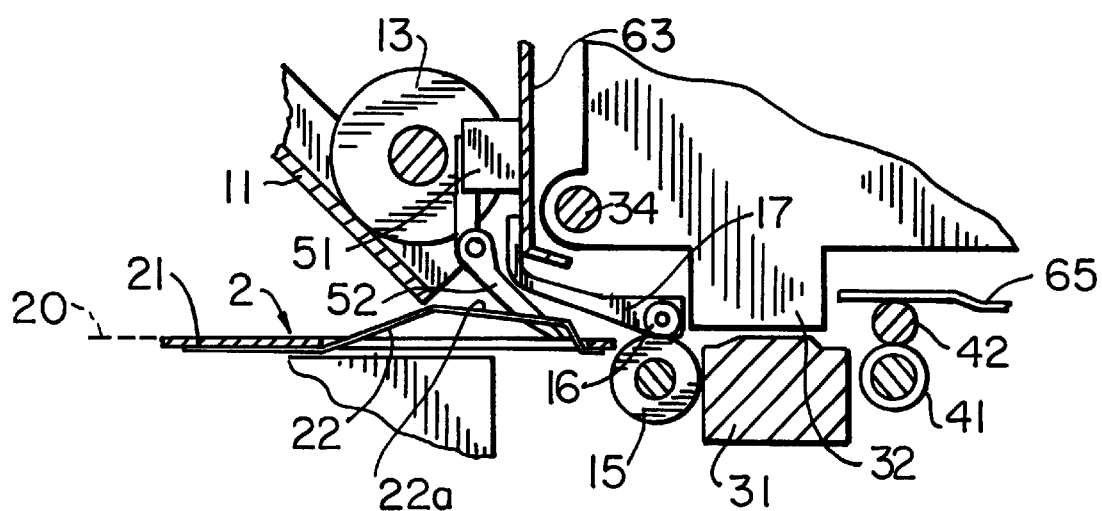
FIG. 4 is an enlarged cross-sectional view taken along line B—B of FIG. 1.

The second supply path 2 is of a small width, such as the width W2 shown in FIG. 1, in the central portion of the first supply path 1, and serves as a path via which to supply to the printing section 3 the recording medium 20, which is thicker than the recording medium 10 and is a rigid member like a CD, of a metal or a resin. As shown in FIGS. 2 and 4, the second supply path 2 constitutes by a tray guide 21 which is disposed on the top surface of the frame 6 to rectilinearly guide the recording medium 20 to the printing section 3.

Figure 5A:
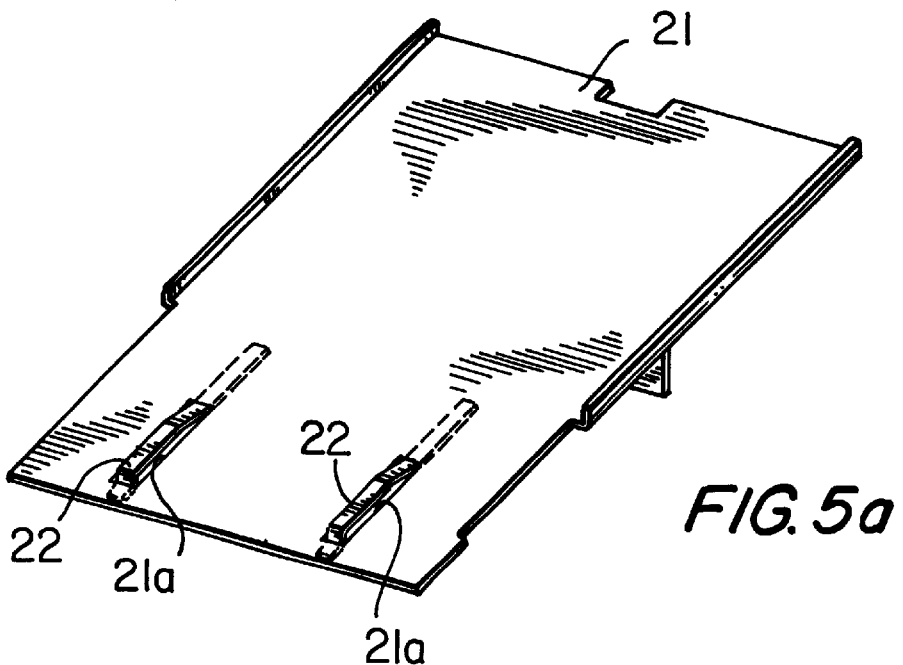
FIG. 5(*a*) is an enlarged perspective view of a tray guide.
Figure 5B:
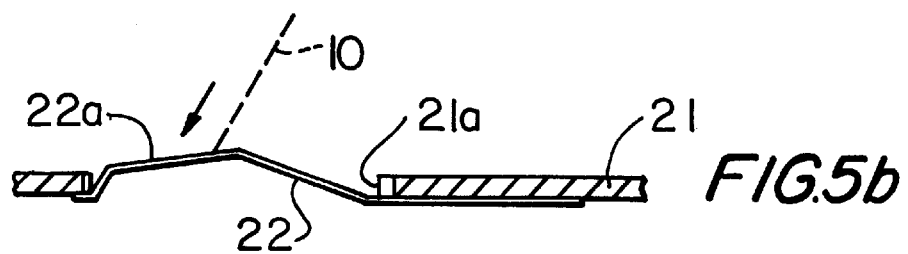

As shown in FIGS. 5(a) and 5(b), cutouts 21a have a small width and are elongated in the traveling direction of the recording medium 20. The cutouts 21(a) are formed on the opposite sides of the front end portion of the tray guide 21. Guide spring members 22 are partly projected from the top surface of the tray guide 21 through the cutouts 21a. Each of the guide spring members 22 uses an elongated leaf spring of small width, a portion of which extends through a corresponding one of the cutouts 21a and is bent in a hill-like shape. One end of the leaf spring is secured to the reverse surface of the tray guide 21. The hill-shaped bent portion is formed so that an inclined surface 22a is located on the side of the printing section 3 and approximately coincides with the inclined surfaces 14a of the guide plates 14 in height and inclination. The guide plates 14 and the guide spring members 22 are disposed in such a manner as to be approximately aligned in the widthwise direction in the meeting portion of the first supply path 1 and the second supply path 2.

As described above, the guide plates 14 and the guide spring members 22 are disposed at a predetermined height. This is because the recording media 10 and 20 differ in thickness, thus the floor positions required to smoothly feed the respective recording media 10 and 20 to the gaps between the feed rollers 15 and the auxiliary rollers 16, differ subtly at the meeting portion of the first supply path 1 and the second supply path 2. Specifically, the recording medium 20 is thicker than recording medium 10 and the floor of the tray guide 21 must be lowered in view of the thickness of the recording medium 20, but if the thinner recording medium 10 is fed from this low floor, there is a risk that the recording medium 10 would not be correctly fed into the gaps between the rollers 15 and 16 and defective feeding occurs. For this reason, it is desirable that the thinner recording medium 10 be fed into the gaps between the rollers 15 and 16 at a predetermined height above the floor of the tray guide 21. The predetermined height of the guide plates 14 and the guide spring members 22 is set to an optimum height for the feeding of the recording medium 10.

Figure 6A:
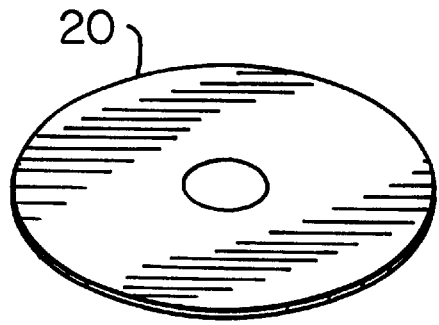
FIG. 6(*a*) is a perspective view of a CD.
Figure 6B:
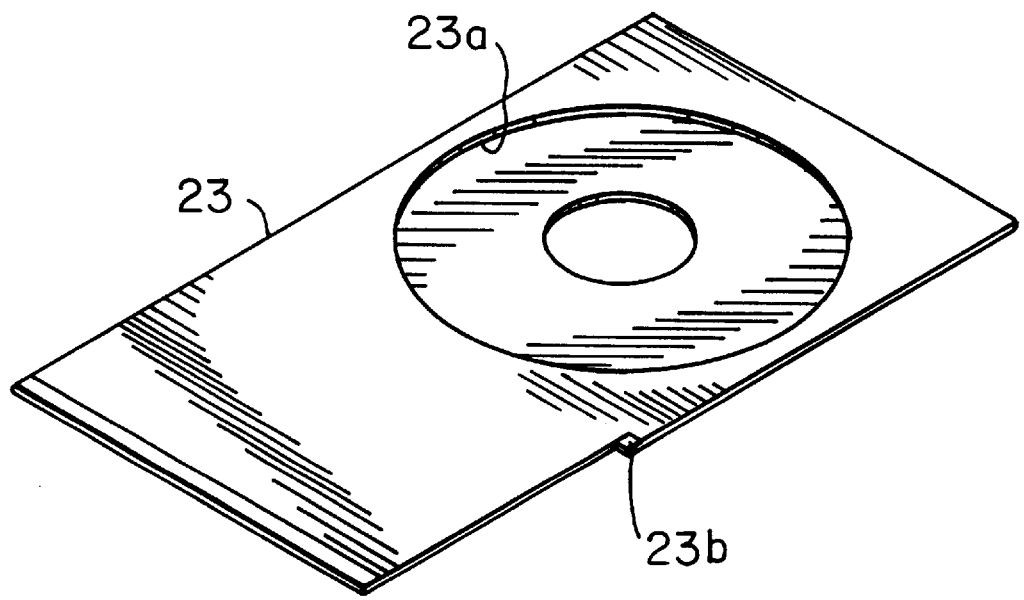

If a CD which is one example of the recording medium 20 is to be supplied from the tray guide 21, a rectangular-tray 23 made of a material such as metal or resin is used. As shown in FIGS. 6(a) and 6(b), a recess 23a which coincides with the shape of the CD, i.e. the recording medium 20, is formed on the top surface of the rear half portion of the tray 23, and a CD 20 is mounted in the recess 23a. The front portion of the tray 23 is cut along one side thereof, and a corner of this side constitutes a sensing portion 23b.

Figure 5C:
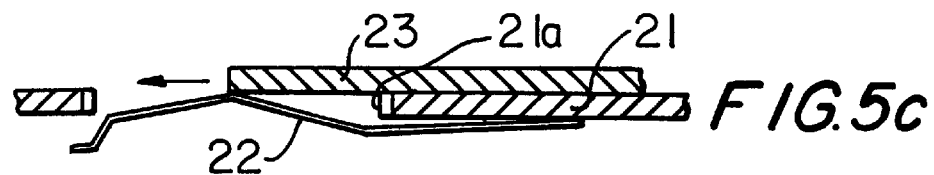

The tray 23 which is set on the tray guide 21 is made to travel forward in a flat state while bending the guide spring members 22 downward, as shown in FIG. 5(c), and is drawn into the gaps between the feed rollers 15 and the auxiliary rollers 16 which are kept in elastic contact with the feed roller 15 and is then supplied to the printing section 3, as in the case of the first supply path 1. Since the width of the tray guide 21 is narrower than the space between the pair of guides 14, the tray 23 bends the guide spring members 22 downward as described above, without making contact with the top surfaces of the guide plates 14.

The feed rollers 13 and the feed rollers 15 are rotationally driven by the motor M1 shown in FIG. 1, via the feed roller shaft 13a and the feed roller shaft 15a, respectively.

The printing section 3 includes a platen 31 which is fixedly disposed within the frames 61 and 62 and is elongated in the widthwise direction, and a print head 32 which is movably disposed with respect to the platen 31. The print head 32 is carried on a carriage 33. The carriage 33 is guided along a guide shaft 34 which is supported at both of its ends by the frame 61 and a frame 64, and is made to travel back and forth in opposite directions perpendicular to the feeding direction of each of the recording media 10 and 20 by the driving force of the motor M2 shown in FIG. 1. While the recording medium 10 or 20 supplied from the first supply path 1 or the second supply path 2 is passing through the gap between the platen 31 and the print head 32 in the printing section 3, ink is ejected from the print head 32 at predetermined times, determined by an external instruction, thereby printing on the top surface of the recording medium 10 or 20.

The delivery section 4 includes delivery rollers 41 which are located downstream of the printing section 3 and auxiliary rollers 42 which are kept in elastic contact with the delivery rollers 41, and serve to deliver a recording medium printed in the printing section 3. The delivery rollers 41 are supported by a delivery roller shaft 41a, and the auxiliary rollers 42 are rotatably connected to a frame 65. The delivery rollers 41 are rotated by the motor M1 shown in FIG. 1 via the delivery roller shaft 41a.

A position sensing device 5 for recording media will be described below. As shown in FIGS. 1 to 4, for example, an optical transmission type of sensor 51 is secured to the frame 63. A lever 52 is interposed between the sensor 51 and the top surface of the recording medium 10 or 20 which is being fed, in order to sense supply and. delivery of the recording medium 10 or 20 by blocking or opening the optical path of the sensor 51. The lever 52 is supported for swinging motion about its approximately central portion, and one (upper) end of the lever 52 is opposed to the sensor 51 to block or open the optical path of the sensor 51, while the other (lower) end of the lever 52 is forced upward by the supply of the recording medium 10 or 20 swinging the lever 52 to open the optical path. The lower end of the lever 52 is positioned so that the lower end is placed in approximate contact with the top surface of the tray guide 21 when the recording medium, 10 or 20 is absent. When the recording medium 10 or 20 is being fed toward the feed rollers 15 the lower end of the lever 52 is forced upward and the lever 52 swings to bring the sensor 51 to a sensing state. That is to say, since the height of the lower end of the lever 52 is increased when the recording medium 10 or 20 is present, the swinging angle of the lever 52 is made large so that the sensor 51 can perform stable sensing. The widthwise position of the lever 52 needs to be a position through which either of the recording media 10 or 20 can pass, and the stability of sensing increases if the recording medium 10 or 20 does not slack when the lower end of the lever 52 is being forced upward. Accordingly, the lower end of the lever 52 is desirably located near either of the guide spring members 22 which support the recording medium 10 or 20 from below, or between either of the guide plates 14 and the adjacent one of the guide spring members 22.

When the leading edge of the recording medium 10 or 20 which has been supplied is sensed by the sensor 51 via the lever 52, the starting position of printing on the recording medium 10 or 20 is set, and when the trailing edge of the recording medium 10 or 20 is sensed, the ending position of printing on the recording medium 10 or 20 is set and the timing of delivery of the recording medium 10 or 20 is also set.

In the above-described construction, if the wide recording medium 10 of width W1 is to be supplied from the first supply path 1, wide recording paper stacked on the CSF 11 is fed out sheet by sheet by the feed rollers 13, and the leading edge of the recording paper is guided by the inclined surfaces 14a of the guide plates 14 and the inclined surfaces 22a of the guide spring members 22 and is drawn into the gaps between the feed rollers 15 and the auxiliary rollers 16 while being gently curved without slacking in the widthwise direction or traveling obliquely. During this time, since the leading edge of the recording paper forces the lower edge of the lever 52 upward and swings the lever 52, the sensor 51 senses the fact that the recording medium 10 has been supplied. As described previously, the recording paper 10 is supported at a predetermined height by the guide plates 14 and the guide spring members 22, the recording medium 10 can withstand, without slacking, a force which forces the lower end of the lever 52 upward, so that the sensor, 51 can perform accurate sensing.

Printing is performed in the above-described manner on the top surface of the recording medium 10 which has been supplied to the printing section 3 by the feed rollers 15 and the auxiliary rollers 16, and the printed recording medium 10 is delivered by the delivery section 4. When the trailing edge of the recording medium 10 passes the lever 52, the lever 52 is restored from its swinging 'state and the sensor 51 returns to a non-sensing state.

If the narrow recording medium 10 of width W2 is to be supplied from the first supply path 1, the opposite feed rollers 13 are moved toward each other according to the width of the recording medium 10, and the recording medium 10 is fed out sheet by sheet. Since the width of the recording medium 10 is small, the recording medium 10 is not guided by the inclined surfaces 14a of the guide plates 14. However, even in this case, since the recording medium 10 is guided by the inclined surfaces 22a of the guide spring members 22 of the tray guide 21 as shown in FIG. 5(b), the recording medium 10 can withstand, without slacking, a force which forces the lower end of the lever 52 upward, and the sensor 51 can perform accurate sensing. The subsequent operations are similar to the above-described ones.

If printing is to be performed on the top surface of the recording medium 20 which is a rigid medium such as a CD, the second supply path 2 is used. In the case of a CD, the CD 20 is mounted in the tray 23. shown in FIG. 6, and the tray 23 is placed on the top surface of the tray guide 21 and is forced toward the printing section 3. Since the top surface of the CD 20 mounted in the tray 23 has a height sufficient to swing the lever 52, the tray 23 travels forward in a flat state while bending the guide spring members 22 downward as shown in FIG. 5(c), and the sensing portion 23b of the tray forces the lower end of the lever 52 upward to swing the lever 52, whereby the sensor 51 can perform accurate sensing. The subsequent operations are similar to the above-described ones.

If printing is also to be performed on the top surface of not. only a CD but, also a rigid plate such as a metal or resin plate having an adequate thickness, the second supply path 2 is used. In this case, the rigid plate is directly placed on the top surface of the tray guide 21 without using the tray, and needs only to be forced toward the printing section 3. The subsequent operations are similar to the case of the above-described CD.

Figure 7:
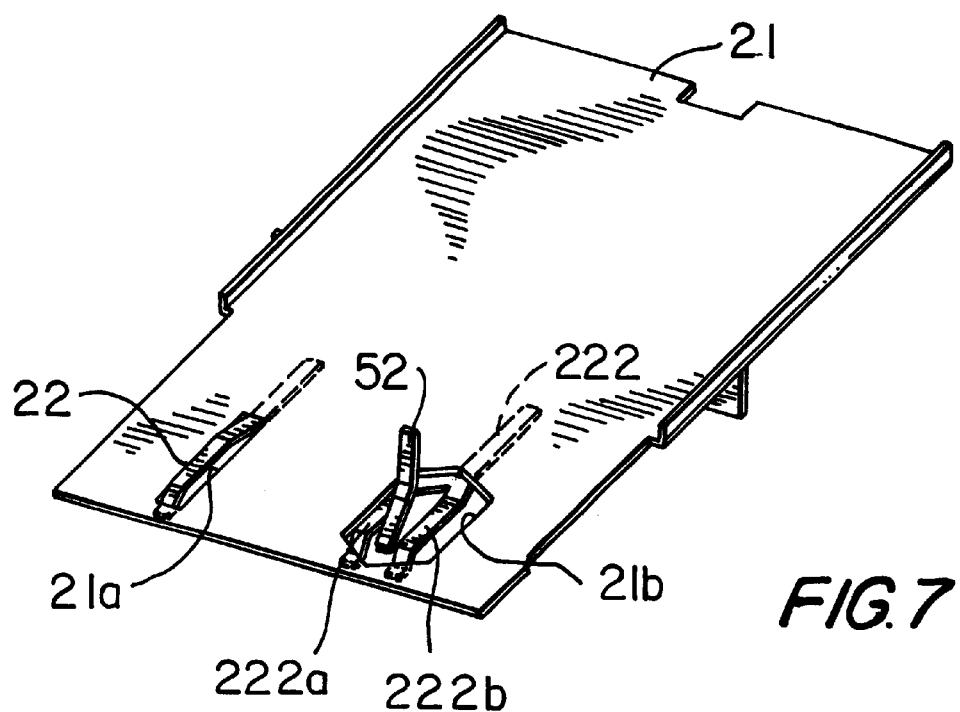
FIG. 7 is an enlarged perspective view showing the relationship between guide spring members and a lever in a position sensing device in a tray guide of another embodiment.

FIG. 7 shows another embodiment, in which one of the guide spring members 22 is identical to the above-described one, but the other is formed as a guide spring member 222 which differs in shape from the guide spring member 22. The guide spring member 222 includes spring portions 222a and 222b which are formed like bifurcate ridges extending from a hill-shaped portion, and the lower end of the lever 52 is located between both spring portions 222a and 222b. A cutout 21b of the tray guide 21 from which the spring portions 222a and 222b are projected is formed to have a larger width than the cutout 21a so that the hill-shaped portion as well as the bifurcate portions can be projected from the cutout 21b. In this case, although only one of the guide spring members 22 is formed as the guide spring member 222, both guide spring members 22 may be formed as the guide spring member 222.

In the above-described construction, if the thin recording medium 10 is to be supplied from the first supply path 1, the recording medium 10 travels forward at a predetermined height and is smoothly guided to the rollers 15 and 16. At the same time, since the recording medium 10 is supported by the bifurcate spring. portions 222a and 222b, the recording medium 10 can stably force the lower end of the lever 52 upward so that the sensing accuracy of the sensor 51 can be assured. Furthermore, it is also possible to supply narrow and thin recording paper by using the second supply path 2. Specifically, the recording paper is not rigid, and if the recording paper is directly placed on the top surface of the tray guide 21 and is forced toward the printing section 3, the leading edge of the recording paper travels forward at a predetermined height along the hill-shaped portions of the guide spring members 22 in the state shown in FIG. 5(b) without bending the guide spring members 22 downward, and is smoothly guided to the rollers 15 and 16. At the same time, the recording paper, which in itself cannot withstand a force which forces the lower end of the lever 52 upward, tends to slack and come into contact with the floor of the tray guide 21. However, in the embodiment shown in FIG. 7, since the lever 52 is located between the bifurcate spring portions 222a and 222b, the spring portions 222a and 222b support the recording medium 10 so that the recording medium 10 becomes partly rigid and able to force the lower end of the lever 52 upward without slacking, whereby the sensing accuracy of the sensor 51 can be assured. The subsequent operations are identical to the above-described ones.

Figure 8:
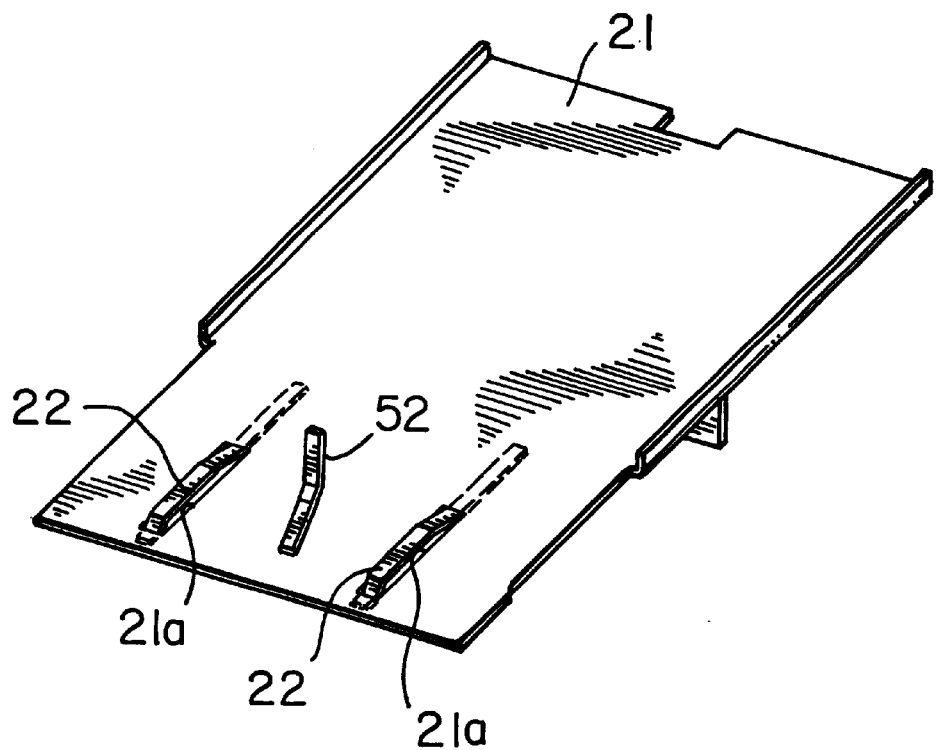
FIG. 8 is an enlarged perspective view showing another example of the relationship between guide spring members and a lever in a position sensing device in a tray guide.

FIG. 8 shows another embodiment in which the lever 52 is disposed at the middle position between the opposite guide spring members 22. In this case as well, it is possible to assure sensing accuracy approximately equal to that assured in the above-described embodiment.

Figure 9:
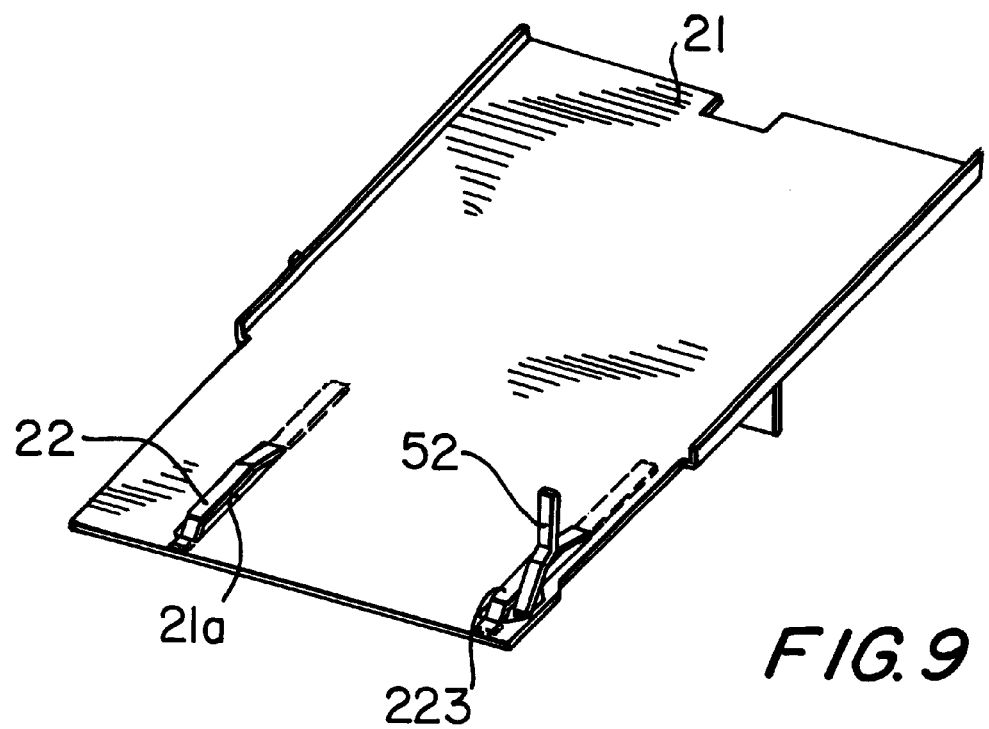
FIG. 9 is an enlarged perspective view showing yet another example of the relationship between the guide spring members and a lever in a position sensing device in a tray guide of yet another embodiment.

In the embodiment shown in FIG. 9, a guide spring member 223 is made close to one side of the tray guide 21, and the lower end of the lever 52 is located on one side of the guide spring member 223 in an end portion of the tray guide 21, i.e. at a position close to one of the guide plates 14. In this case, the space between this guide plate 14 and the guide spring member 223. is narrow and the recording paper does not easily slack, whereby the sensing accuracy of the sensor 51 can be assured.

Figure 10:
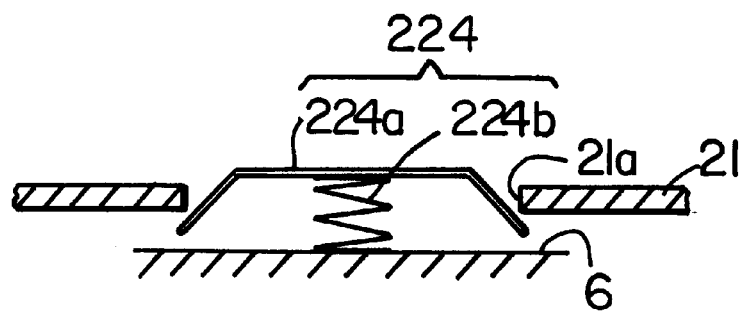
FIG. 10 is an enlarged perspective view showing another example of a guide spring member.

FIG. 10 shows another example of a guide spring member. A guide spring member 224 does not use a leaf spring, and includes a plate-shaped guide portion 224a and a compression spring 224b which is disposed on the bottom surface of the guide portion 224a. The guide portion 224a is desirably formed in a hill-like shape similarly to the above-described guide spring members 22, and the hill-shaped portion is projected from the cutout 21a of the tray guide 21. The lower end of the compression spring 224b is secured to the frame 6. The operation of this example is substantially identical to that of each of the above-described embodiments.

It is to be noted that each of the guide plates 14 may also have a construction identical to that of the guide spring member 22. Even with this construction, it is possible to achieve an effect similar to the above-described one.

Although each of the guide spring members 22 is made from one leaf spring member by way of example, the number of leaf spring members is not limited to one, and a plurality of leaf spring members may be stacked to form each of the guide spring members 22.

Although printing means for the printing section 3 has been described as an ink-jet printer, various other printing means may be applied to the printing section as printers which supply recording media to the same.

In accordance with the present invention, first and second supply paths for recording media having different thicknesses can readily be constructed, and guide spring members for supporting a thin recording medium at a predetermined height are disposed in the meeting portion of both supply paths. Accordingly, the recording medium can be stably supplied to a printing section without slacking in the widthwise or defective feeding, whereby it is possible to obtain good print quality similar to that obtainable in the case of a thick recording medium. Since a general-purpose printer capable of handling cut paper and a special printer capable of handling a special recording medium such as a CD can be realized with one printer, it is possible to provide an inexpensive printer with a simple construction.

In addition, since a recording medium which passes the vicinities of the guide embers is sensed by a position sensing device, sensing having stable accuracy can be achieved.

What is claimed is:

1. A printer comprising:

a first supply path for supplying a first recording medium;

a second supply path for supplying a second recording medium, the second supply path being straight and the second recording medium being rigid;

a printing section for printing on said first recording medium supplied from said first supply path or said second recording medium supplied from said second supply path; and a guide member for guiding the recording medium to the printing section at a level in accordance with the thickness of the recording medium; wherein said guide member is a guide spring member which includes a plate-shaped guide portion and a compression spring disposed on a bottom surface of said plate shaped guide portion.

2. A printer according to claim 1, wherein said guide member is located upstream of said printing section and in a meeting portion of said first supply path and said second supply path.

3. A printer according to claim 1, wherein said guide member serves to support a top surface of the first recording medium at a predetermined height.

4. A printer according to claim 1, wherein a feed roller is provided in said printing section such that said recording medium passes from said guide member and through said feed roller at said level in accordance with the thickness of said recording medium.

5. A printer according to claim 4, wherein said second supply path is brought into the flat state when said guide spring member is moved down while the rigid recording medium is being supplied.

6. A printer according to claim 1, wherein the rigid second recording medium has a disk-like shape, and is mounted in a disk-shaped recess provided in a rectangular tray.

7. A printer according to claim 1, further comprising a position sensing device for sensing the recording medium which passes a vicinity of said guide member.

8. A printer according to claim 1, wherein said guide spring member alternates between an up position and a down position, said guide spring member assuming said up position in response to a first recording medium to support said first recording medium at a predetermined height above a level for feeding said first recording medium to said printing section, and said guide spring member assuming a down position in response to a second recording medium for passing said second recording medium to said printing section at said level.

9. A printer according to claim 1, wherein said guide member responds to the thickness of the recording medium.

\* \* \* \* \*